US005497007A

United States Patent [19]
Uritsky et al.

[11] Patent Number: 5,497,007
[45] Date of Patent: Mar. 5, 1996

[54] METHOD FOR AUTOMATICALLY ESTABLISHING A WAFER COORDINATE SYSTEM

[75] Inventors: Yuri S. Uritsky, Newark; Harry Q. Lee, Mountain View, both of Calif.

[73] Assignee: Applied Materials, Inc., Santa Clara, Calif.

[21] Appl. No.: 379,246

[22] Filed: Jan. 27, 1995

[51] Int. Cl.$^6$ .................................................. G01B 21/04
[52] U.S. Cl. ........................................ 250/491.1; 250/307
[58] Field of Search ................................. 250/491.1, 307; 382/148, 151; 364/571.01; 356/375

[56] References Cited

U.S. PATENT DOCUMENTS

| | | | |
|---|---|---|---|
| 5,381,004 | 1/1995 | Uritsky et al. | 250/307 |
| 5,430,666 | 7/1995 | DeAngelis et al. | 250/491.1 |
| 5,444,245 | 8/1995 | Kitamura | 250/307 |

*Primary Examiner*—Jack I. Berman
*Attorney, Agent, or Firm*—Raymond R. Moser, Jr.

[57] ABSTRACT

An automated method for establishing a wafer coordinate system for a wafer characterization system. Specifically, under computer control, a high-magnification imaging system images a wafer at a low, initial magnification level. From this imaging process, the method first determines the location of the center of the semiconductor wafer mounted within the imaging system and then determines the wafer orientation therein. The method then repeats the imaging process at increased magnification levels until a desired degree of magnification is used to accurately define the location of the wafer center and the wafer orientation. Together the wafer center and orientation define a wafer coordinate system. This wafer coordinate system is then related to the coordinate system of the imaging system by a coordinate system transformation. As such, once the coordinate systems are related, the imaging system can quickly and accurately determine any point on a wafer. The method uses various wafer edge locations to determine the wafer center location and wafer orientation. These edge locations are determined by either: (1) using a scanning electron microscope in conjunction with an image processing technique, or (2) using an energy dispersive x-ray detector to detect changes in the $SiK_\alpha$ line intensity.

20 Claims, 8 Drawing Sheets

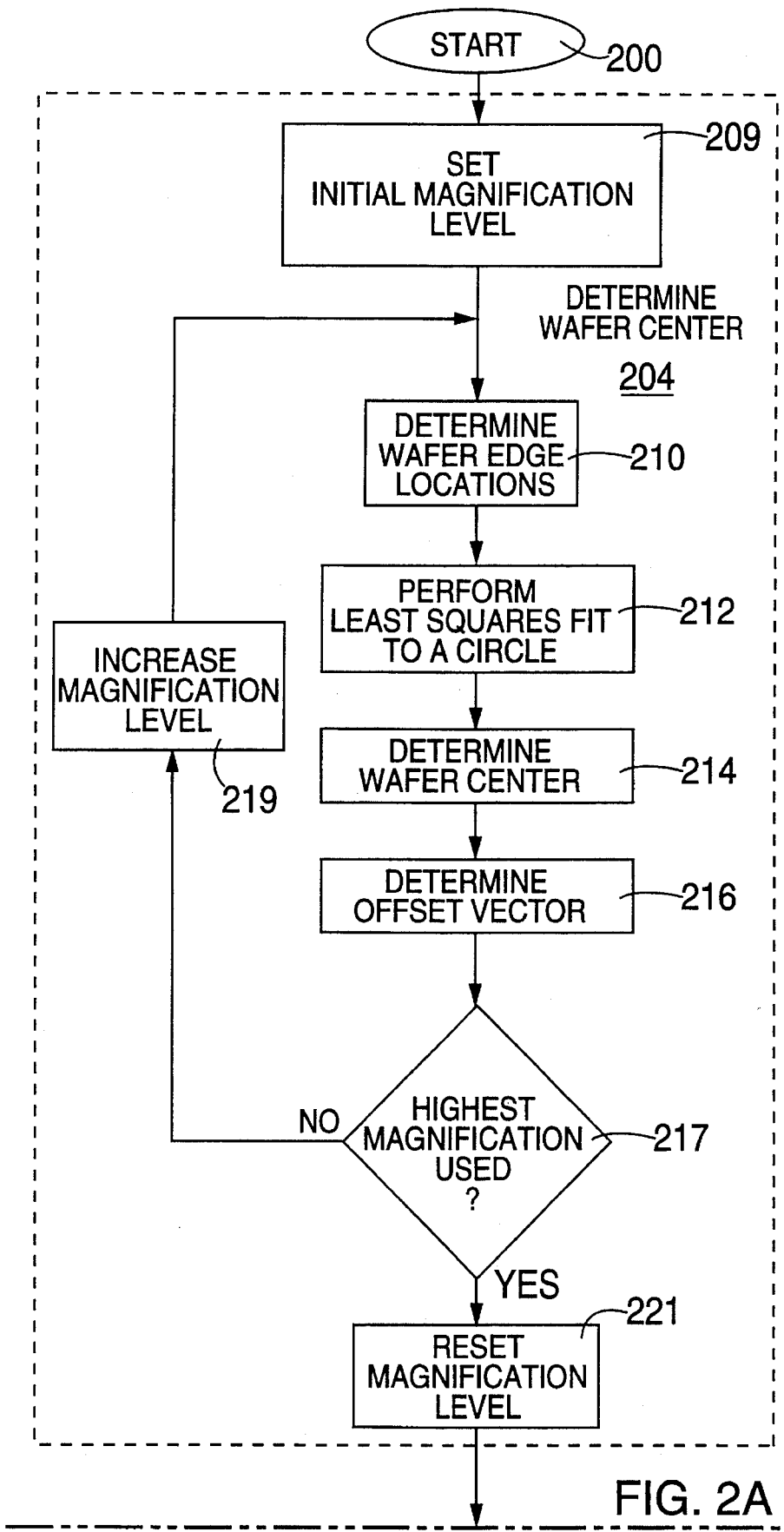

METHOD FOR AUTOMATICALLY ESTABLISHING A WAFER COORDINATE SYSTEM

BACKGROUND OF THE DISCLOSURE

1. Field of the Invention

The invention relates to semiconductor wafer characterization equipment and, more particularly, to techniques for automatically locating particles on a semiconductor wafer using a high-magnification imaging system.

2. Description of the Background Art

Semiconductor wafer characterization equipment typically includes a high-magnification imaging system such as a scanning electron microscope (SEM) coupled to an energy dispersive x-ray (EDX) detector. Such an imaging system, when used to scan a semiconductor wafer, provides information regarding particles and anomalies on the surface of the wafer. The combination of a SEM and an EDX within a common unit is generally known as a SEM/EDX unit. Such a SEM unit is Model Number JSM-IC848A manufactured by Geol and an illustrative EDX unit is Model Number Delta IV manufactured by Kevex.

A SEM/EDX unit provides, at a high magnification level, information concerning particle shape, morphology and chemical composition. Such information is useful for determining root cause contamination sources within semiconductor wafer processing systems. Such contamination relates directly to device yield variations during processing of semiconductor wafers. Consequently, effectively determining and eliminating root cause contamination sources is extremely important to the semiconductor industry.

In order to gather such information, however, it is necessary to define in unambiguous terms the position of any arbitrary point on the wafer such that the imaging system can repeatably locate that point. As such, the imaging system is used to locate anomalies and contaminant particles on the wafer surface. Analysis of the anomalies and particles provides contamination information that is used to eliminate the source of the contaminants.

However, because the particle dimensions are on the order of 0.1–1.0 mm, imaging system magnification must be on the order of 200 to 2000 times such that a particle can be observed on the imaging system display. If the imaging system is a SEM, then the imaging system display is typically a cathode ray tube (CRT). At such high magnification levels, only a small portion of the wafer (e.g., a 50 μm by 50 μm area) is visible on the imaging system display at any one time. Thus, the particle positions must be accurately known before the high-magnification imaging system can be used to view the particles.

Because the image viewing area in a high-magnification imaging system is relatively small, a high-magnification imaging system is generally considered inappropriate for providing a general overview of the surface of a semiconductor wafer. As such, other devices have been developed for this purpose and a two stage process for locating and analyzing particles is generally employed. In the first stage, a laser scanning device raster scans the wafer surface with a laser beam to locate most of the particles on the wafer surface. An example of such a device is a Tencor SurfScan 6200, manufactured by Tencor Instruments. The laser scanner creates a laser scan map of the coordinates of the wafer features and concomitant particles. This laser scan map uses, of course, the coordinate system of the laser scanning device to identify the location of surface features and particles. The manner in which the laser beam is scattered from the wafer surface features and particles yields signals from which estimated particle positions in terms of x and y coordinates can be determined. However, because the scattering mechanism is not completely understood, the signals are of little help in identifying the type, chemical composition, and possible source of contaminant particles. This specific information can only be obtained with the aid of a high magnification imaging system such as an SEM/EDX unit.

A critical aspect of this two-stage particle analysis technique is that the coordinate system used in the laser scanning device must be transformed to the coordinate system used in the high-magnification imaging system. Since the wafer is physically moved from the laser scanner to the imaging system, there is no way to guarantee that the coordinate system used in the laser scanner will apply when the wafer is moved to the imaging device. The wafer may be inadvertently rotated and/or origin coordinates of the two systems may not be the same. Therefore, the particle coordinates obtained from the laser scanner must be transformed to corresponding coordinates used in the imaging system such that the particles can be found and analyzed. To further complicate matters, the imaging system coordinate system which is generally calibrated relative to a wafer support such as a SEM stage is not the same as the wafer coordinate system. The wafer coordinate system is defined relative to the geometry of each wafer. Depending upon the wafer geometry, the wafer coordinate system may be offset and rotated from the imaging system coordinate system.

To provide a common coordinate system for the imaging system, the laser scanner, and the semiconductor wafer, the physical geometry of the wafer must be mapped onto the fixed coordinate system of the imaging system. The physical geometry of the wafer includes locations of particles upon the wafer surface, a location of a flat or notch on the edge of the wafer indicating wafer orientation, and the location of the center of the wafer. This physical geometry can be used to define a wafer coordinate system.

One technique used to provide a common coordinate system for notched wafers is disclosed in U.S. Pat. No. 5,381,004, issued Jan. 10, 1995, and herein incorporated by reference. This patent discloses a manual technique for determining a coordinate system for a SEM unit and transforming that coordinate system to a laser scanner coordinate system. In particular, the SEM unit coordinate system is determined by a SEM unit user manually aligning the "cross-hairs" on the SEM unit display with a plurality of wafer edge locations. At each location, the user notes the coordinates of the locations in the SEM unit coordinate system. These edge location coordinates are used to determine coordinates for a center of the wafer.

Additionally, the SEM unit user then locates a notch on the edge of the wafer and, by aligning the cross hairs of the display with the edges of the notch, determines coordinate locations for points within the notch. These points are used to determine a composite notch point that provides a single coordinate for the notch location. The center location of the wafer relative to the origin of the laser scanner coordinate system provides an offset for the coordinate system transformation. Furthermore, the position of the notch relative to its former position in the laser scanner coordinate system provides a measure of the rotation of the wafer relative to the laser scanner coordinate system. Using this offset and rotation measure, a coordinate system transformation can be derived that transforms the SEM unit coordinate system to the laser scanner coordinate system. Since the intent of the method disclosed in the '004 patent is to transform the SEM coordinate system to the laser scanner coordinate system, this patent does not specifically disclose a process for formally generating a wafer coordinate system that can be transformed to any other reference coordinate system.

In general, transformation between two coordinate systems can be completely defined by an offset and rotation angle. That is to say, the transformation from one coordinate system to another can be considered to include a linear movement of the x and y axes so that the new origin assumes a position displaced from the old origin, together with a rotation of the axes about the origin to a new angular orientation. Such coordinate transformations are well known, and simple equations for performing them may be found in almost any basic text on linear algebra, coordinate geometry, or related subject matter. For example, transformations are completely defined in a text by John J. Craig entitled "Introduction to Robotics: Mechanics and Control," 2nd edition, published by Addison-Wesley Publishing Company, Inc. (1989), and specifically on pages 25–30. The transformation equations can also be found in "Elementary Linear Algebra," by Howard Anton, pp. 229–30, published by Anton Textbooks, Inc. (1987).

A significant disadvantage of a manual coordinate system alignment method is that establishing the coordinate system takes an inordinate amount of time (on the order of one hour). As such, for each semiconductor wafer that is to be characterized within the SEM unit, one hour must be spent to align each semiconductor wafer, just to establish a wafer coordinate system in which characterization can be accomplished. Additionally, since a manual approach requires a SEM operator to visually align cross hairs on the SEM display with the edges of the wafer, an error can easily be made. Such an error would result in an erroneous coordinate system transformation and ultimately in an erroneous wafer characterization of the particles on the surface thereof.

Therefore, a need exists in the art for an automated method of quickly and accurately establishing a wafer coordinate system within a high-magnification imaging system.

SUMMARY OF THE INVENTION

The invention is an automated method for establishing a wafer coordinate system in a high-magnification imaging system such as a SEM/EDX unit. Specifically, under computer control, the imaging system images a semiconductor wafer with reference to an imaging system coordinate system. At an initial magnification level, the inventive method first automatically determines the location of the center of the semiconductor wafer and then determines the wafer orientation. Thereafter, the method increases the magnification level of the imaging system and again determines the location of the wafer center and wafer orientation. This process is repeated until a maximum magnification level is attained which provides a sufficient degree of accuracy for the wafer center location and the wafer orientation. The wafer center and orientation define a wafer coordinate system relative to the imaging system coordinate system. This wafer coordinate system can then be related to any reference coordinate system, e.g., the coordinate system of a laser scanner, the imaging system coordinate system and the like. As such, once the two coordinate systems are related, the imaging system can quickly and accurately determine any point on the wafer from a point within the reference coordinate system (or vice versa).

In general, the method determines the points along the edge of the wafer by monitoring an output signal from an imaging device such as an x-ray detector, a SEM unit coupled to an image processing system, and the like. In essence, any imaging device that can accurately detect the location of the wafer edge can be used by the inventive method.

In one specific embodiment of the method, the invention determines, using an SEM/EDX unit, the points along the edge of the wafer by monitoring the $SiK_\alpha$ line intensity that results from electron bombardment of a silicon wafer. The x-ray detector within the SEM/EDX unit effectively measures this line intensity. The $SiK_\alpha$ line intensity is relatively large for all points within the semiconductor wafer and is zero for all points outside of the semiconductor wafer, that is, for all points upon the SEM stage. As such, the location of the edge of the semiconductor wafer is determined by monitoring a transition in the $SiK_\alpha$ line intensity. The method uses these edge locations to determine both the wafer center and the wafer orientation.

Utilization of this automated method for establishing the wafer coordinate system in a high-magnification imaging system significantly the speed at which the system determines a wafer coordinate system. Specifically, the invention can establish the coordinate system of the wafer within 10 minutes, as compared to the manual techniques of the prior art which can take up to one hour to determine a wafer coordinate system.

BRIEF DESCRIPTION OF THE DRAWINGS

The teachings of the present invention can be readily understood by considering the following detailed description in conjunction with the accompanying drawings, in which:

FIG. 2 depicts the proper arrangement of the FIGS. 2A and 2B.

FIGS. 2A and 2B together depict a flow chart of a method for establishing a wafer coordinate system for a high-magnification imaging system such as the SEM/EDX unit of FIG. 1;

To facilitate understanding, identical reference numerals have been used, where possible, to designate identical elements that are common to the figures.

DETAILED DESCRIPTION

Figure 1:
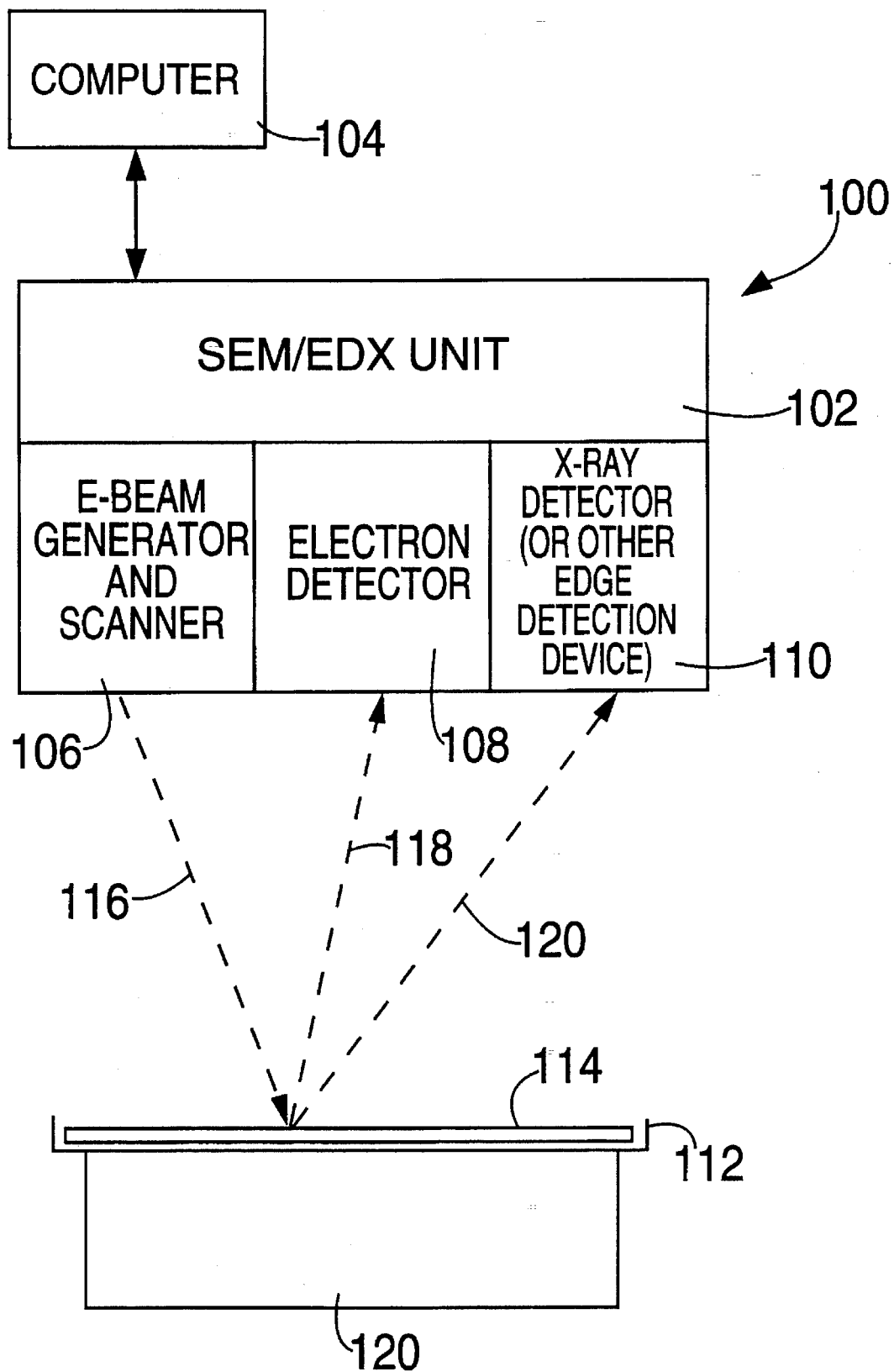
FIG. 1 depicts a block diagram of a SEM/EDX unit that utilizes the invention.

FIG. 1 depicts block diagram of an illustrative computer controlled high-magnification imaging system 100. The illustrative system combines a high-magnification imaging device, such as a scanning electron microscope (SEM) or similar high magnification imaging device, with an wafer edge detection device such as an energy dispersive x-ray detector(EDX). The combined unit is known as an SEM/EDX unit. In accordance with a preferred embodiment of the invention, the system 100 utilizes an automated method for establishing a wafer coordinate system for a SEM/EDX unit 102. A computer 104 generally controls operation of the SEM/EDX unit. Specifically, the unit contains an electron beam generator and scanner 106, an electron detector 108, an x-ray detector 110, and a SEM stage 112 for supporting a semiconductor wafer 114. In operation, the computer controls the electron beam intensity, scan rate and position relative to a coordinate system of the SEM stage (also referred to as a SEM/EDX unit coordinate system or an imaging system coordinate system). SEM/EDX unit coordinate system is a two-dimensional (x-y) coordinate system lying in the plane of the SEM stage. The computer also controls mechanical stage positioning equipment 120 that positions the SEM stage beneath the SEM/EDX unit. By adjusting the position of the SEM stage, the SEM/EDX unit can scan any portion of the wafer.

Additionally, the computer also collects and analyzes data from both the electron detector 108 and the x-ray detector 110. In operation, the electron beam 116 is typically scanned across the wafer 114 in a raster scan manner. Upon bombardment by the electron beam, the semiconductor wafer emits electrons 118 from a portion of the wafer presently being bombarded. These emitted electrons are collected by the electron detector 108 within the SEM/EDX unit 102. The computer uses the intensity profile of these electrons to form an image that depicts the morphology of the semiconductor wafer.

In addition to emitting electrons, the semiconductor wafer also emits x-rays 120 from the area of the wafer under bombardment. The wavelength and intensity of the x-ray radiation, as measured by the x-ray detector, is indicative of the chemical properties of the bombarded portion of the semiconductor wafer. Consequently, by analyzing both electron emission and x-ray emission from the semiconductor wafer, the computer system can depict the morphology of the semiconductor wafer as well as analyze the chemical make-up of the semiconductor wafer and the various contaminant particles that lie on the wafer surface. Nonetheless, to accurately depict and analyze the semiconductor wafer surface anomalies and to achieve analysis repeatability, the wafer coordinate system must be related to the coordinate system of the SEM/EDX unit.

The wafer coordinate system is defined by the location of the center of the wafer and the orientation angle of the wafer relative to the imaging system coordinate system. The orientation angle of the wafer is defined by the position of a significant wafer landmark, typically, the wafer notch or flatted portion. As such, the wafer coordinate system is arbitrarily defined having one axis (first axis) extending along a line from the center of the wafer to the landmark location. The other axis (second axis) of the coordinate system extends from the center of the wafer and perpendicular to the first axis. This wafer coordinate system is related to the imaging system coordinate system by an offset vector that defines the difference between the origin of the imaging system coordinate system and the center of the wafer. Additionally, the wafer coordinate system is related to the imaging system coordinate system by a rotation angle between the two coordinate systems. The offset vector and the rotation angle define a coordinate system transformation. By relating the imaging system coordinate system to the wafer coordinate system in this manner, the high-magnification imaging system can repeatedly find any location in the wafer coordinate system. Further, if another reference coordinate system (e.g., a coordinate system generated by a laser scanner device used in an earlier stage of wafer processing) need be used, a transformation from the wafer coordinate system to that reference coordinate system is trivial.

Figure 2B:
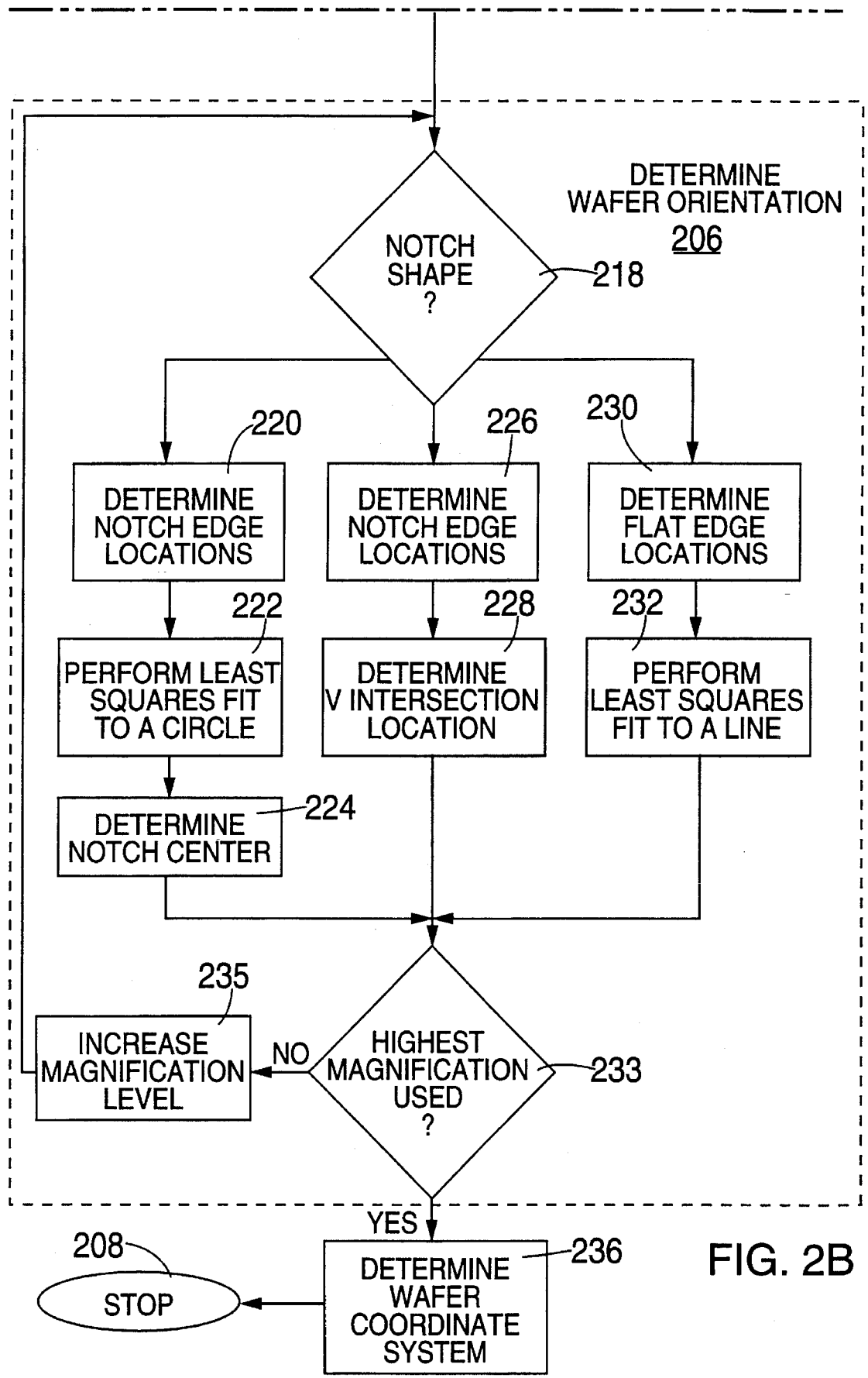

FIG. 2 depicts the proper arrangement of the FIGS. 2A and 2B. In combination, FIGS. 2A and 2B depict a flow chart of a method 200 for automatically establishing a wafer coordinate system in the high-magnification imaging system and relating that coordinate system to the imaging system coordinate system. Specifically, to determine such a coordinate system, first a center of the semiconductor wafer must be accurately determined using subroutine 204. For convenience, the method uses the center of the circular wafer as the origin of the wafer coordinate system. To complete the coordinate system, the method, using subroutine 206, accurately determines the orientation (rotation angle) of the wafer relative to the imaging system coordinate system. All locations determined by the method described below are determined by the imaging system using the imaging system coordinate system. Once the method defines the wafer coordinate system all coordinates values (e.g., laser scanner coordinates, imaging system coordinates, and the like) can be transformed to the wafer coordinate system.

More specifically, at step 209, the method sets an initial magnification level that is used to find the coordinates of points along the edge of the wafer. An illustrative initial magnification level is twenty times (20×).

Figure 3:
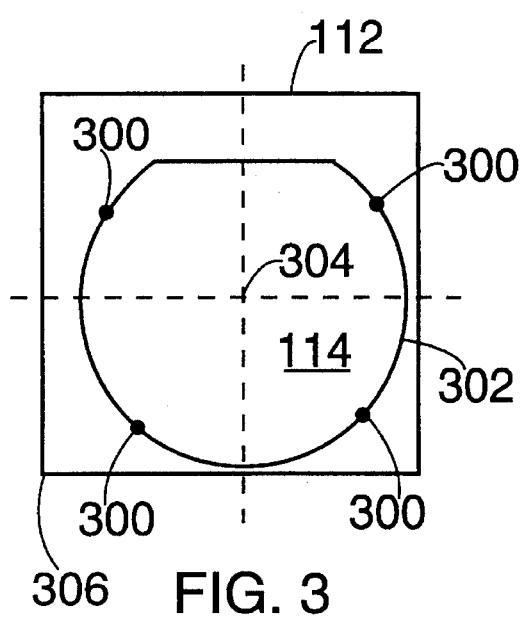
FIG. 3 depicts a flatted wafer mounted on a SEM stage.

To determine the location of the center of the semiconductor wafer, at step 210, the method uses the high-magnification imaging system to determine the location of at least three points on the edge of the semiconductor wafer. As shown in FIG. 3 (flatted wafer) or FIG. 4 (notched wafer), the points 300 are generally spaced equidistant about the periphery 302 of the wafer 114. These points 300 are not located in either the notched area or the flatted portion of the semiconductor wafer. Typically, the wafer is maintained on the SEM stage by a specimen holder that is roughly the shape of the wafer and a spring loaded pin (or key) that interacts with the an edge of the wafer. The pin maintains the wafer in a stationery position within the specimen holder. An operator roughly aligns the specimen holder with predefined markings on the SEM stage. As such, each wafer that is analyzed is generally oriented in the same direction, i.e., the notch or flatted portion of the wafer points in roughly the same direction relative to the stage. The imaging system is calibrated using a specimen holder that is aligned with the markings; thus, the system knows roughly the location of the notch or flatted portion of the wafer. Consequently, to avoid coordinates near or in the notch or flat while determining the wafer center, the method does not use edge coordinates that are near the known location.

From the three edge point coordinates, at step 212 in FIG. 2, the method performs a least squares fit to a circle such that the coordinates of all points on the edge of the semiconductor wafer are now determined. From the computed circle, at step 214, the method determines the location of the center of the wafer (304 in FIG. 3 and 4). The method deems the coordinates of the wafer center as the origin of the wafer coordinate system. As such, the origin of the wafer coordinate system can be related to the origin of the imaging system coordinate system (e.g., a corner 306 of the SEM stage 112 in FIG. 3). At step 216, the method creates an offset vector that references the wafer center to the imaging system coordinate system origin. This offset vector is key to transforming any coordinate location within the wafer coordinate system onto any coordinate location in the SEM/EDX unit coordinate system. However, to fully ascertain the wafer coordinate system, the rotational orientation of the wafer relative to the SEM stage coordinate system must also be known.

At step 217, the method queries whether the highest magnification level was used to determine the edge coordinates. If this query is answered negatively, the method proceeds to step 219. At step 219, the method increases the magnification level of the SEM/EDX unit. Typically, the magnification level is increased by ten times (e.g., from 20× to 200×, or 200× to 2000×, and so on). Through empirical study, a maximum magnification level of 2000 times is generally sufficient for accurately determining edge coordinates for the wafer. The method repetitively increases the magnification level and executes steps 210, 212, 214, and 216. During each pass through subroutine 204, the method updates the coordinates determine at each edge location. As the coordinates are more accurately resolved with each pass, the wafer center is also more accurately computed. Consequently, the method also corrects the offset vector using these updated coordinates of the wafer center. When the query of step 217 is ultimately answered affirmatively, the method resets, at step 221, the magnification level to its initial level and proceeds to subroutine 206.

Figure 4:
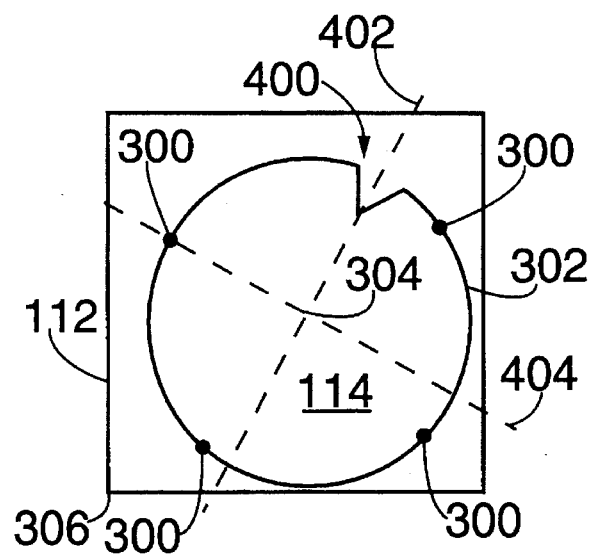
FIG. 4 depicts a notched wafer mounted on a SEM stage.

Once the method determines the offset vector using subroutine 204, the inventive method, using subroutine 206, determines the wafer orientation with respect to the imaging system coordinate system. The method must determine this orientation based on the position of an obvious wafer landmark such as the notch or flatted portion of the wafer. Specifically, as illustrated in FIG. 4, the wafer center location 304 coupled with the notch (or flat) location 400 defines a first axis 402 of a wafer coordinate system. A second axis 404 of the wafer coordinate system is perpendicular to the first axis and extends from the wafer center.

Figure 5:
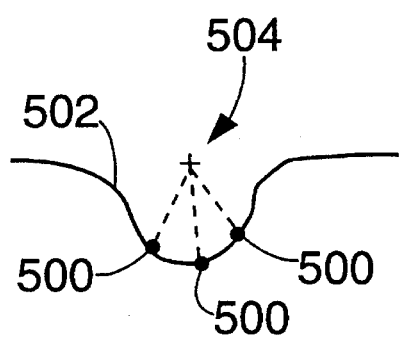
FIG. 5 depicts a magnified view of a V-shaped notch.

Returning to FIG. 2B, the wafer orientation determining subroutine 206 of the method queries, at step 218, what the shape of the notch is, e.g., whether the shape is V-shape, a rounded shape or if there is a flatted portion. If the notch is rounded, then the method determines, at step 220, at least three notch edge locations. As shown in FIG. 5, the notch edge locations 500 are located about the notch edge 502. From these notch edge locations, a least squares fit to a circle is performed (at step 222 of FIG. 2) to determine the center 504 of a circle that passes through each of the three notch edge locations. The method deems this center the notch location, and as such, the wafer with a rounded notch has one axis of its coordinate system pass through this point and through the center of the wafer. The equations involved in performing a least squares fit to a circle are well known and can be found, for example, in a text by D. Kahaner, et al., entitled "Numerical Methods and Software," published by Prentice Hall (1989).

Figure 6:
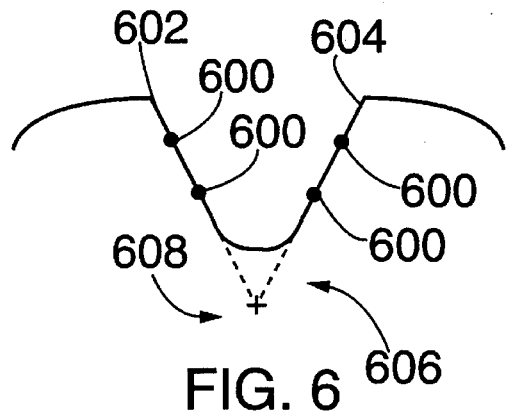
FIG. 6 depicts a magnified view of a rounded notch.

If the notch is a V-shape, then as shown in FIG. 6, the method determines (at step 226 in FIG. 2) the notch edge locations 600 along the legs 602, 604 of the V-shaped notch 606, by measuring two locations 600 on each leg 602, 604 of the V and determining (at step 228) an intersection 608 of two lines through the two locations in each leg of the V. That intersection is deemed the location of the notch for purposes of determining a wafer coordinate system axis. An example of the equations used to determine a V-shaped notch location are discussed in U.S. Pat. No. 5,381,004, issued Jan. 10, 1995 and herein incorporated by reference.

Figure 7:
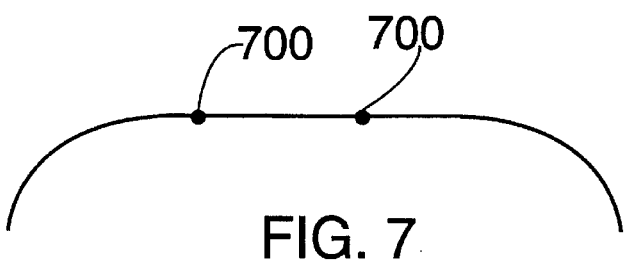
FIG. 7 depicts a magnified view of a flatted portion of a semiconductor wafer.

As shown in FIG. 7, if the semiconductor wafer contains a flatted edge, then the method determines (at step 230) the number of flat edge locations 700, in this case two, and then performs (at step 232) a least squares fit to a line function to determine the location of the flatted edge with respect to the coordinate system of the imaging system.

Those skilled in the art will realize that more points than just three can be used to determine the edge locations in the process to determine the wafer center and also any number of edge locations can be used in determining the orientation of the notch or flatted portion within the SEM/EDX unit coordinate system.

At step 233, the method queries whether the highest magnification level was used to determine the edge coordinates for the landmark (notch or flat). If this query is answered negatively, the method proceeds to step 235. At step 235, the method increases the magnification level of the SEM/EDX unit. Typically, the magnification level is increased by ten times (e.g., from 20× to 200×, or 200× to 2000×, and so on). Through empirical study, a maximum magnification level of 2000 times is generally sufficient for accurately determining edge coordinates of the wafer. The method repetitively increases the magnification level and executes the appropriate steps of subroutine 206 depending upon the notch profile. During each pass through subroutine 206, the method updates the coordinates defining the landmark and the landmark location. When the query of step 233 is answered affirmatively, the method proceeds to step 236.

At step 236, the method defines the wafer coordinate system and computes a transformation from the imaging system coordinate system to the wafer coordinate system. The wafer coordinate system is defined having a first axis extending from the wafer center (origin) through the landmark location and a second axis extends from the origin and is orthogonal to the first axis. The offset vector and the rotation angle between the two coordinate systems provide sufficient information for a simple coordinate system transformation to be accomplished.

The rotation angle is given by the following equation:

$$\theta = \tan^{-1}\left(\frac{x_{landmark} - x_{center}}{y_{landmark} - y_{center}}\right) \quad (1)$$

where:

θ is the rotation angle;

$x_{landmark}, y_{landmark}$ is the notch location in the imaging system coordinate system; and $x_{center}, y_{center}$ is the wafer center location in the imaging system coordinate system.

The translation vector is defined by the following equation:

$$v = [x_{center} \; y_{center}] \quad (2)$$

where:

V is the offset vector (assuming imaging system coordinate system origin is at location (0,0); and $x_{center}, y_{center}$ is location of the origin of the wafer coordinate system in terms of the imaging system coordinate system.

Consequently, the transformation of a point $(x_i, y_i)$ provided in the imaging system coordinate system to a point $(x_w, y_w)$ in the wafer coordinate system is as follows:

$$(x_w, y_w) = [(x_i, y_i) + V]\begin{bmatrix} \cos\theta & \sin\theta \\ -\sin\theta & \cos\theta \end{bmatrix} \quad (3)$$

where:

V is the offset vector of Equation 2; and

θ is the rotation angle of Equation 1.

Using Equation 3, the location of a point $(x_i, y_i)$ in the imaging system coordinate system is scaled by the offset vector V and then the scaled coordinates are rotated by the rotation angle θ. As such, any point given in imaging system coordinates can be transformed into wafer coordinate system coordinates.

Those skilled in the art can easily generate an inverse transform from Equation 3 that can transform wafer coordinates into imaging system coordinates. Also, if a third reference coordinate system is used, for example, in either previous or future wafer processing stages, the wafer coordinate system can easily be transformed to that third reference coordinate system as well. Thus, once a wafer coordinate system is established for a given wafer, that coordinate system can be used during other wafer processing stages to locate specific portions of the wafer. The '004 patent referred to above discloses a detailed example of a manually operated system using equations similar to those above in a particular scenario involving transforming laser scanner coordinates to imaging system coordinates.

The method shown in FIGS. 2A and 2B uses a fixed magnification level while each subroutine determines all the edge locations used by that particular subroutine. Then, that fixed magnification level is increased and the locations are refined using the higher magnification level. Those skilled in the art will understand that the magnification level could be increased after all the steps in the method were complete. As such, the method would contain a single loop rather than two cascaded loops as depicted in FIGS. 2A and 2B.

In another alternative embodiment of the invention, the method increases the magnification level after each individual edge location is initially found and incrementally increases the magnification level further until that particular location is accurately determined. Thereafter, the method moves the SEM stage to position the electron beam on another edge location and that location is determined using incrementally increasing magnification levels. In this manner, the method accurately determines each edge location before moving to the next edge location.

To automatically determine a location of an edge of a wafer, the high-magnification imaging system detects the presence or absence of the wafer. In general, such detection is performed by any imaging system that can detect a transition from the wafer surface to the SEM stage or specimen holder, or detect a transition from the planar surface of the wafer to the edge of the wafer.

One method of edge detection uses the SEM unit in conjunction with some rudimentary image analysis techniques to detect image contrast between the wafer edge and the wafer planar surface. Specifically, the secondary electrons that are detected by the SEM unit are different for edge emitted electrons versus electrons emitted from the planar surface of the wafer. As a result, the image generated by the SEM unit typically portrays the wafer edges at a greater brightness than the planar wafer surface. For example, see the SEM micrograph shown in FIG. 8. This characteristic can be exploited to accurately define the wafer edge coordinates. By digitally capturing the SEM image and analyzing the captured image using well-known image analysis techniques, coordinates along the edge of the wafer can be computed. Such image analysis is disclosed in a text by Jay Lim entitled "Two Dimensional Signal and Image Processing", published by Prentice Hall (1989). Further, by repeatedly using the image analyzing techniques at increasing magnification levels, the method accurately determines the edge and landmark coordinates.

In a second method of automatically detecting the edge of a wafer, the EDX unit in a SEM/EDX unit is used to detect the silicon emission line ($SiK_\alpha$) from the semiconductor wafer as it is bombarded with electrons from the SEM/EDX unit. The transition point between a high $SiK_\alpha$ emission line presence and no $SiK_\alpha$ emission line presence defines a wafer periphery point. The location of the periphery point is defined by the impact point of the electron beam when the $SiK_\alpha$ line transitions from high to low.

Figure 8:
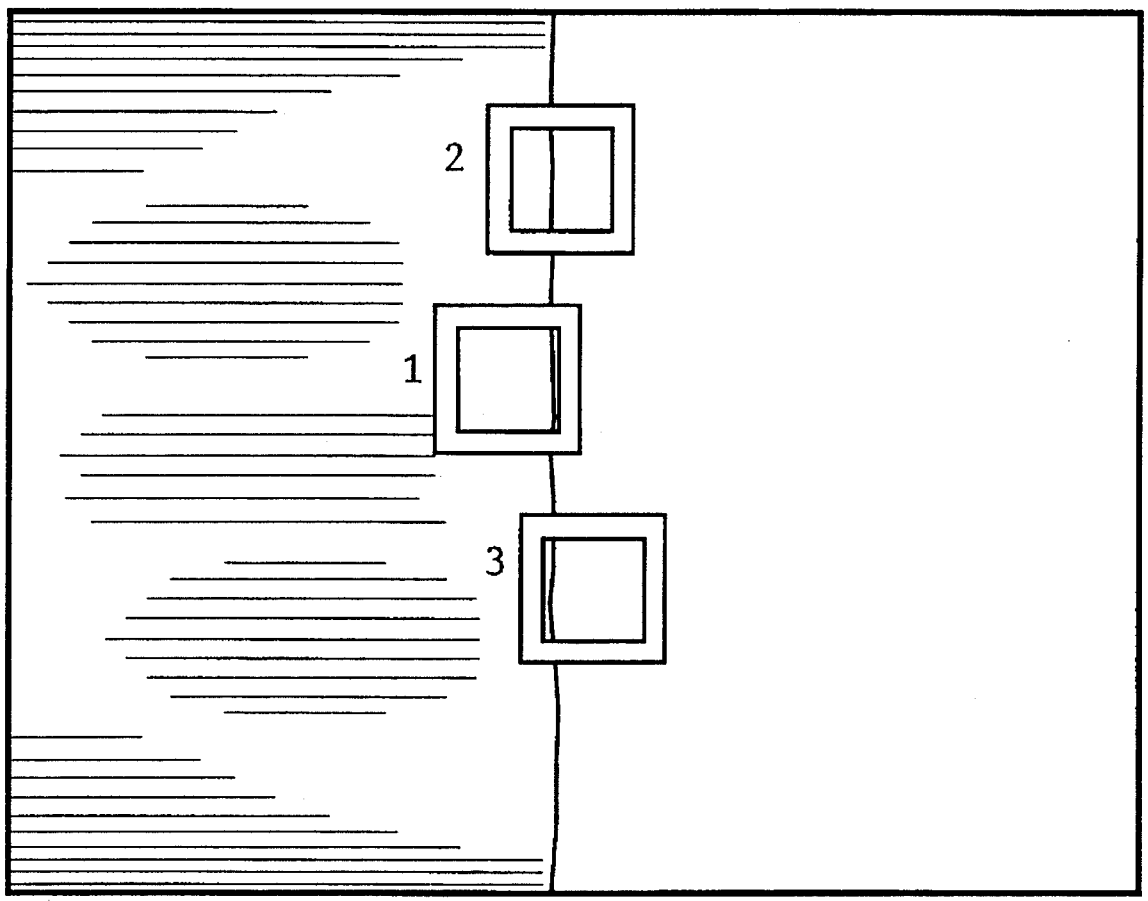
FIG. 8 depicts a SEM micrograph of a semiconductor wafer edge overlaid with rectangular areas indicating the locations of three scan areas.

FIG. 8 depicts a SEM micrograph of a wafer edge. Superimposed upon this micrograph are three electron beam scan areas, Area 1, Area 2 and Area 3. Each of these areas are positioned at slightly different locations with respect to the edge of the semiconductor wafer.

Figure 9:
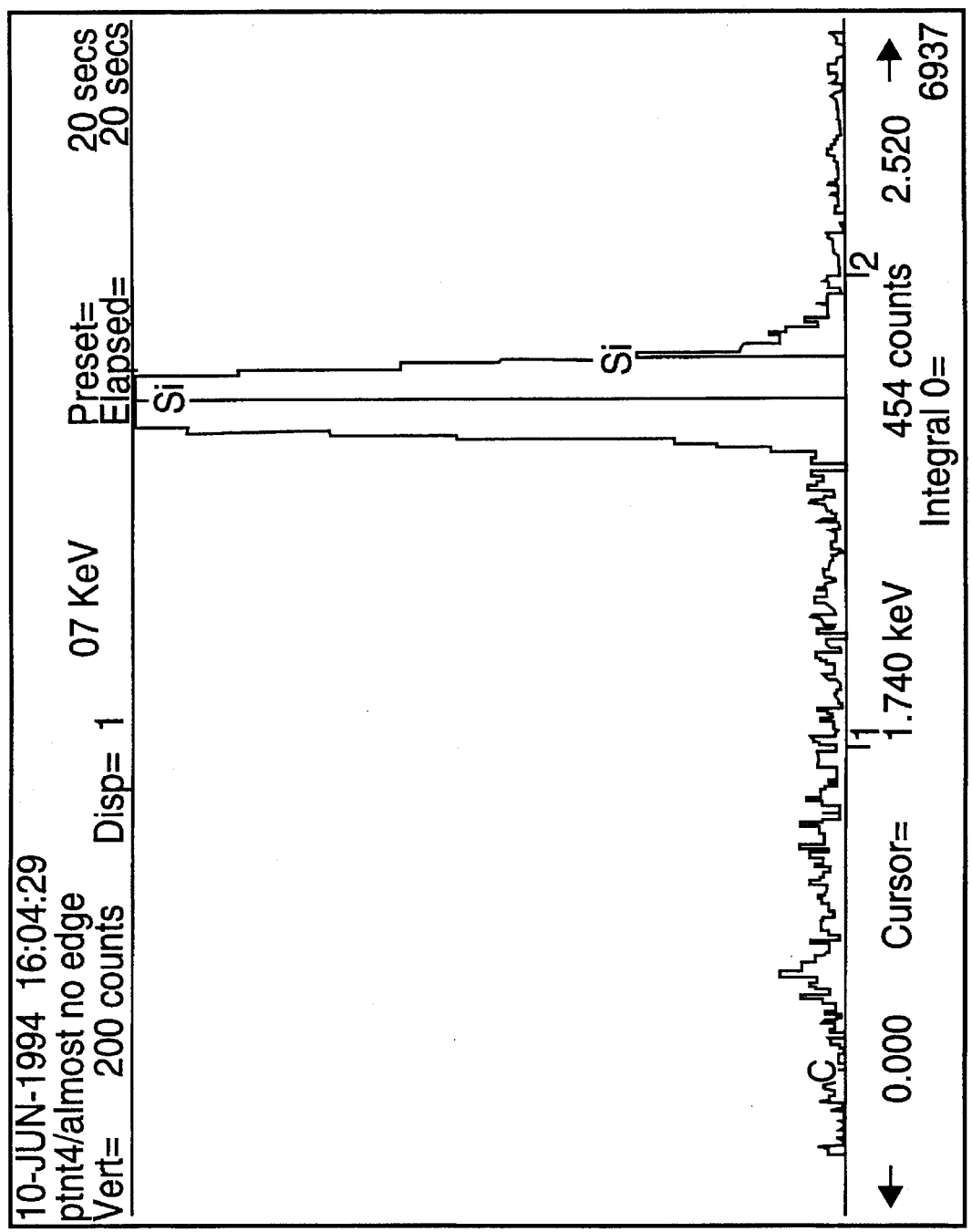
FIG. 9 depicts the $SiK_\alpha$ line intensity measured within Area 1 of FIG. 8.
Figure 10:
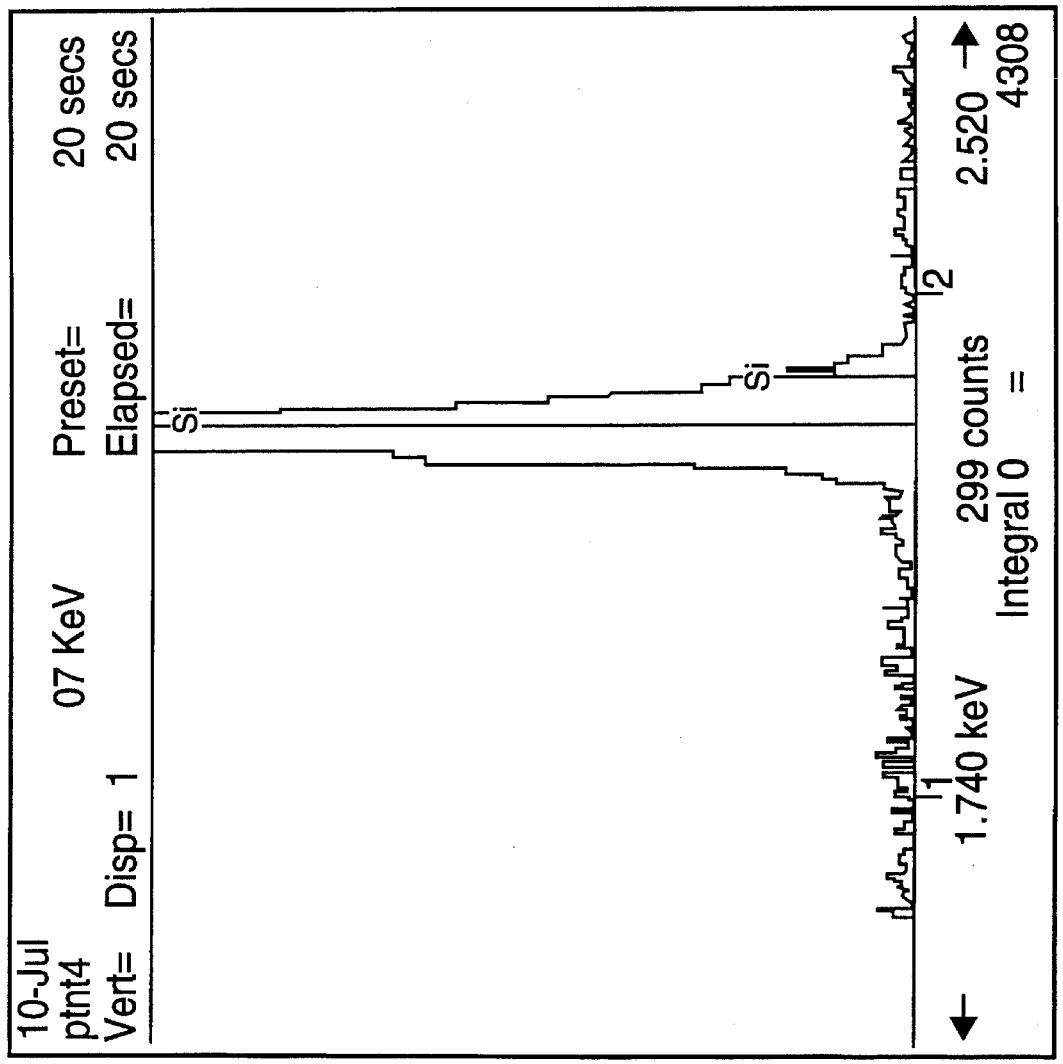
FIG. 10 depicts the $SiK_\alpha$ line intensity measured within Area 2 of FIG. 8.
Figure 11:
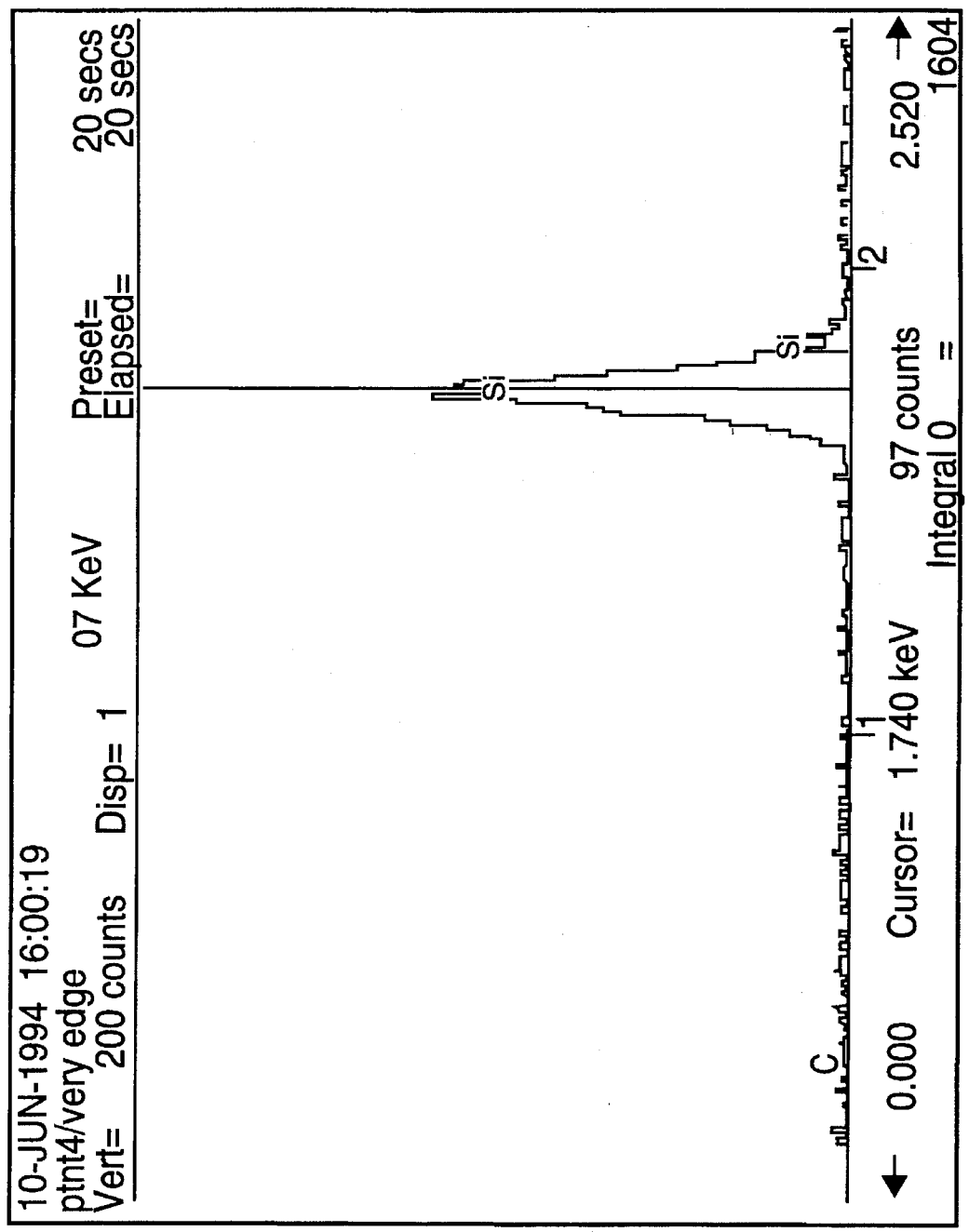
FIG. 11 depicts the $SiK_\alpha$ line intensity measured within Area 3 of FIG. 8.

FIGS. 9, 10 and 11 depict graphs of an energy density spectrum, respectively, for each of scan areas 1, 2, and 3 as measured by the x-ray detector in the SEM/EDX unit. The $SiK_\alpha$ emission line is the prominent artifact in each graph. The acquisition time for each scan was approximately 20 seconds. Specifically, Area 1 is a scan area just entering the wafer periphery; Area 2 is a scan area halfway inside and halfway outside the wafer periphery; and Area 3 is a scan area just barely containing the wafer periphery. The size of each area was 10 micrometers by 10 micrometers. The $SiK_\alpha$ intensity levels within each scan area are summarized in Table 1.

TABLE 1

| AREA | X-RAY COUNT |
|------|-------------|
| 1    | 454         |
| 2    | 299         |
| 3    | 97          |

As summarized in Table 1, the $SiK_\alpha$ emission line decreases from 454 counts for Area 1 to 299 counts for Area 2, and lastly, to 97 counts for Area 3. The energy density spectrums recorded by the SEM/EDX unit for each of these areas are shown respectively in FIGS. 9, 10 and 11. Since the decrease in the intensity of the $SiK_\alpha$ emission line is correlated with the precise location of the wafer periphery point, the wafer periphery point is easily determinable. Consequently, by establishing a threshold criterion for the emission line intensity, the SEM/EDX unit determines the wafer edge location as the location of the electron beam on the wafer surface at the time the $SiK_\alpha$ emission line intensity becomes less than the threshold criterion.

The accuracy in locating the wafer periphery point using this automated method is typically within 20 micrometers of the actual periphery point. Because the SEM/EDX measuring process is repeatable, a log file of the systemic error can be recorded and the error can be reduced using well-known correlation methods.

Utilization of this automated method for determining the wafer coordinates in a SEM/EDX system much improves the speed at which a common wafer coordinate system is determined. The system can establish the coordinate system of the wafer within ten minutes, as compared to the manual operation which can take up to one hour to determine the wafer coordinate system.

Furthermore, this automated method permits the wafer to be arbitrarily oriented in the imaging system coordinate system as long as the general location of the landmark region is known to the imaging system. The landmark region must be approximately known so that the method can avoid the landmark during the subroutine that determines the wafer center and easily find the landmark during the subroutine that determines the landmark location.

Although various embodiments which incorporate the teachings of the present invention have been shown and described in detail herein, those skilled in the art can readily devise many other varied embodiments that still incorporate these teachings.

What is claimed is:

1. A method for establishing a wafer coordinate system comprising the steps of:
   (a) setting an initial magnification level for a wafer imaging system;
   (b) determining coordinates of a wafer center location in an imaging system coordinate system;
   (c) increasing the magnification level of the wafer imaging system;
   (d) repeating step (b) and (c) until a maximum magnification level is attained;
   (e) resetting the magnification level to the initial magnification level;
   (f) determining coordinates of a wafer landmark location in an imaging system coordinate system;
   (g) increasing the magnification level of the wafer imaging system;
   (h) repeating step (f) and (g) until a maximum magnification level is attained;
   (i) defining a wafer coordinate system.

2. The method of claim 1 further comprising the step of determining a transformation between the imaging system coordinate system and the wafer coordinate system.

3. The method of claim 1 wherein step (b) further comprises the steps of:
   determining coordinates for a plurality of wafer edge locations;
   performing a least squares fit to a circle to determine a circle that passes through substantially all the coordinates for said plurality of wafer edge locations; and
   determining coordinates for a center location of said circle.

4. The method of claim 3 wherein the step of determining coordinates for a plurality of wafer edge locations further comprises the steps of:
   imaging the wafer;
   capturing an image containing a portion of the wafer having increased contrast over the brightness of a planar portion of the wafer; and
   analyzing the captured image to determine the coordinates of an edge location represented by the increased contrast portion.

5. The method of claim 3 wherein the step of determining coordinates for a plurality of wafer edge locations further comprises the steps of:
   monitoring an output signal from an energy dispersive x-ray detector that is responsive to $SiK_\alpha$ intensity line emitted by the wafer when the wafer is bombarded by electrons; and
   capturing, as wafer edge coordinates, coordinates of the electron beam on the surface of the wafer at a point where the output signal falls below a predefined threshold level.

6. The method of claim 1 wherein said wafer landmark is a notch in the edge of the wafer.

7. The method of claim 1 wherein said wafer landmark is a flatted portion of the edge of the wafer.

8. The method of claim 1 wherein said step of defining said wafer coordinate system further comprises the steps of:

defining an origin of a wafer coordinate system as the wafer center location;

defining a first axis of said wafer coordinate system as a line extending from said origin through said landmark location; and defining a second axis of said wafer coordinate system as a line extending from said origin and orthogonal to said first axis.

9. The method of claim 8 further comprising the step of determining a transformation between the imaging system coordinate system and the wafer coordinate system.

10. The method of claim 9 wherein transformation determining step further comprises the steps of:
    determining a transformation vector defined by the origin of the imaging system coordinate system and the coordinates in the imaging system coordinate system of the wafer center; and
    determining a rotation angle from the angle between an axis of the imaging system coordinate system and an axis of the wafer coordinate system.

11. A method for establishing a wafer coordinate system comprising the steps of:
    (a) setting an initial magnification level for a wafer imaging system;
    (b) determining a coordinate location on a wafer edge in an imaging system coordinate system;
    (c) increasing the magnification level of the wafer imaging system;
    (d) repeating steps (b) and (c) until a maximum magnification level is attained;
    (e) repeating steps (a), (b), (c) and (d) until a plurality of wafer edge coordinate locations are determined;
    (f) determining coordinates of a wafer center location in an imaging system coordinate system using the plurality of wafer edge coordinate locations;
    (h) setting an initial magnification level for the wafer imaging system;
    (i) determining a coordinate location of a landmark location in an imaging system coordinate system;
    (j) increasing the magnification level of the wafer imaging system;
    (k) repeating steps (i) and (j) until a maximum magnification level is attained;
    (l) repeating steps (h), (i), (j) and (k) until a plurality of landmark coordinate locations are determined;
    (m) determining coordinates of a composite landmark location in an imaging system coordinate system using the plurality of landmark coordinate locations;
    (f) defining a wafer coordinate system using said coordinates of said wafer center and said landmark locations.

12. The method of claim 11 further comprising the step of determining a transformation between the imaging system coordinate system and the wafer coordinate system.

13. The method of claim 11 wherein step (f) further comprises the steps of:
    performing a least squares fit to a circle to determine a circle that passes through substantially all the coordinates for said plurality of wafer edge locations; and
    determining coordinates for a center location of said circle.

14. The method of claim 13 wherein the step of determining coordinates for a wafer edge location further comprises the steps of:
    imaging the wafer;

capturing an image containing a portion of the wafer having increased contrast over the brightness of a planar portion of the wafer; and analyzing the captured image to determine the coordinates of an edge location represented by the increased contrast portion.

15. The method of claim 13 wherein the step of determining coordinates for a wafer edge locations further comprises the steps of:

monitoring an output signal from an energy dispersive x-ray detector that is responsive to $SiK_\alpha$ intensity line emitted by the wafer when the wafer is bombarded by electrons; and capturing, as wafer edge coordinates, coordinates of the electron beam on the surface of the wafer at a point where the output signal falls below a predefined threshold level.

16. The method of claim 11 wherein said landmark is a notch in the edge of the wafer.

17. The method of claim 11 wherein said landmark is a flatted portion of the edge of the wafer.

18. The method of claim 11 wherein said step of defining said wafer coordinate system further comprises the steps of:

defining an origin of a wafer coordinate system as the wafer center location;

defining a first axis of said wafer coordinate system as a line extending from said origin through said landmark location; and defining a second axis of said wafer coordinate system as a line extending from said origin and orthogonal to said first axis.

19. The method of claim 18 further comprising the step of determining a transformation between the imaging system coordinate system and the wafer coordinate system.

20. The method of claim 19 wherein transformation determining step further comprises the steps of:

determining a transformation vector defined by the origin of the imaging system coordinate system and the coordinates in the imaging system coordinate system of the wafer center; and determining a rotation angle from the angle between an axis of the imaging system coordinate system and an axis of the wafer coordinate system.

* * * * *